(12) United States Patent
Velmurugan et al.

(10) Patent No.: US 10,930,511 B2
(45) Date of Patent: Feb. 23, 2021

(54) COPPER ELECTRODEPOSITION SEQUENCE FOR THE FILLING OF COBALT LINED FEATURES

(71) Applicant: Lam Research Corporation, Fremont, CA (US)

(72) Inventors: Jeyavel Velmurugan, Gaithersburg, MD (US); Bryan Buckalew, Tualatin, OR (US); Thomas Ponnuswamy, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/941,267

(22) Filed: Mar. 30, 2018

(65) Prior Publication Data
US 2019/0304789 A1  Oct. 3, 2019

(51) Int. Cl.
| H01L 21/288 | (2006.01) |
| C25D 3/38 | (2006.01) |
| C25D 17/00 | (2006.01) |
| C25D 17/06 | (2006.01) |
| C25D 5/10 | (2006.01) |

(Continued)

(52) U.S. Cl.
CPC ........... *H01L 21/2885* (2013.01); *C25D 3/38* (2013.01); *C25D 5/10* (2013.01); *C25D 5/34* (2013.01); *C25D 17/001* (2013.01); *C25D 17/06* (2013.01); *H01L 21/28568* (2013.01); *H01L 21/3212* (2013.01); *H01L 21/7684* (2013.01); *H01L 21/76846* (2013.01); *H01L 21/76873* (2013.01);

(Continued)

(58) Field of Classification Search
None
See application file for complete search history.

(56) References Cited

U.S. PATENT DOCUMENTS

| 6,517,894 B1 | 2/2003 | Hongo et al. |
| 7,964,506 B1 * | 6/2011 | Ponnuswamy .......... C25D 3/38 |
| | | 257/E21.311 |

(Continued)

OTHER PUBLICATIONS

International Application Serial No. PCT/US2019/024723, International Search Report dated Aug. 2, 2019, 9 pgs.

(Continued)

*Primary Examiner* — Moazzam Hossain
*Assistant Examiner* — Stanetta D Isaac
(74) *Attorney, Agent, or Firm* — Schwegman Lundberg & Woessner, P.A.

(57) ABSTRACT

In one example, an electroplating system comprises a first bath reservoir, a second bath reservoir, a clamp, a first anode in the first bath reservoir, a second anode in the second bath reservoir, and a direct current power supply. The first bath reservoir contains a first electrolyte solution that includes an alkaline copper-complexed solution. The second bath reservoir contains a second electrolyte solution that includes an acidic copper plating solution. The direct current power supply generates a first direct current between the clamp and the first anode to electroplate a first copper layer on the cobalt layer of the wafer submerged in the first electrolyte solution. The direct current power supply then generates a second direct current between the clamp and the second anode to electroplate a second copper layer on the first copper layer of the wafer submerged in the second electrolyte solution.

13 Claims, 6 Drawing Sheets

(51) Int. Cl.
    *C25D 5/34*         (2006.01)
    *H01L 21/321*     (2006.01)
    *H01L 23/532*     (2006.01)
    *H01L 21/285*     (2006.01)
    *H01L 21/768*     (2006.01)

(52) U.S. Cl.
    CPC .. *H01L 21/76879* (2013.01); *H01L 23/53209* (2013.01); *H01L 23/53238* (2013.01)

(56) References Cited

U.S. PATENT DOCUMENTS

| | | |
|---|---|---|
| 2005/0139478 A1 | 6/2005 | Chen |
| 2007/0125657 A1 | 6/2007 | Sun et al. |
| 2009/0194430 A1 | 8/2009 | Shalyt et al. |
| 2015/0267312 A1* | 9/2015 | Jiang .................... A44C 21/00 428/610 |
| 2015/0299886 A1 | 10/2015 | Doubina et al. |

OTHER PUBLICATIONS

International Application Serial No. PCT/US2019/024723, Written Opinion dated Aug. 2, 2019, 7 pgs.
"International Application Serial No. PCT/US2019/024723, International Preliminary Report on Patentability dated Oct. 15, 2020", 9 pgs.

* cited by examiner

COPPER ELECTRODEPOSITION SEQUENCE FOR THE FILLING OF COBALT LINED FEATURES

FIELD

The present disclosure relates generally to electroplating systems and methods, and in particular to systems and methods for electroplating copper directly on a cobalt liner.

BACKGROUND

In conventional electroplating methods, copper electrodeposition in the presence of additives can produce void-free plating of submicron features such as vias and trenches in dual-damascene metallization. This approach is conventionally practiced for fabricating interconnects in advanced microprocessors at sub-50 nm technology nodes. However, as interconnects shrink in dimension, scaling the interconnect metallization process to narrower geometries becomes increasingly difficult. For example, physical vapor deposition (PVD) of copper on the cobalt liner can result in undesirable defects such as protrusion, or "overhang," at the feature opening, leading to pinch-off. Furthermore, sidewall step coverage of these small features can also result in sidewall voiding after plating. Such defects can lead to electrical shorts and reliability problems.

The present disclosure seeks to address these drawbacks. It should be noted that the information described in this section is provided to provide the skilled artisan some context for the following disclosed subject matter and should not be considered as admitted prior art.

DESCRIPTION OF THE DRAWINGS

Some embodiments are illustrated by way of example and not limitation in the views of the accompanying drawings.

DESCRIPTION

The description that follows includes systems, methods, techniques, instruction sequences, and computing machine program products that embody illustrative embodiments of the present inventive subject matter. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright LAM Research Corporation, 2018, All Rights Reserved.

In the present disclosure, various terms are used to describe a semiconductor processing surface: "wafer" and "substrate" may be used interchangeably. The process of depositing, or plating, metal onto a conductive surface of the wafer via an electrochemical reaction may be referred to generally as "electrodeposition" or "electroplating."

A wafer includes features such as trenches and vias that form interconnects. As the interconnects shrink in dimension (e.g., sub-50 nm scale), metallization of the features in narrower geometries becomes increasingly more difficult. Advanced interconnect technology (sub-50 nm) is migrating away from copper plating onto copper PVD seed to copper plating directly onto cobalt liner. Traditionally, the filling of interconnect structures with PVD copper seed has been accomplished in a simple, single-bath sequence. Applying this same single bath strategy to filling cobalt-lined structures offers some challenges: conventional acid baths can result in cobalt dissolution, which results in nucleation issues and sidewall voiding. Cobalt dissolution can be mitigated by the use of an alkaline copper-complexed plating bath. However, the use of alkaline copper-complexed plating bath is generally insufficient because the alkaline copper-complexed plating bath can still result in seam or center voids defects in the features.

To address the above challenges, a two-bath sequence is being described. A first electrodeposition of a copper nucleation layer is performed in a first bath consisting of an alkaline copper-complexed bath. This first electroplating process uses electrodeposition chemistries that enable copper nucleation and uniform deposition on the wafer (e.g., a 300 mm resistive wafer). A bath of alkaline complexed-copper electrolytes can achieve high copper nucleation density and plating uniformity. Alkaline complexed-copper electrolytes have lower susceptibility to seed layer dissolution in comparison to an acid medium. Therefore, one benefit of directly plating on cobalt from an alkaline complexed-copper bath is that sidewall voiding is minimized or eliminated.

A second electrodeposition of copper filling of the features is performed in a second bath consisting of an acidic copper plating bath following the first bath. The "superfill" of copper prevents the formation of seam or center voids in the features of the wafer.

In some example embodiments of the present disclosure, an electroplating process that uses a sequence comprising a cobalt pretreatment of a wafer, followed by a first electroplating bath consisting of an alkaline copper-complexed bath, and followed by a second electroplating bath consisting of an acid copper plating bath is provided. This electroplating sequence enables direct deposition of a copper layer on a cobalt liner on the features of a wafer without resulting in seams or voids in the vias and trenches of the wafer.

In some example embodiments of the present disclosure, an electroplating system comprises a first bath reservoir, a second bath reservoir, a clamp, a first anode in the first bath reservoir, a second anode in the second bath reservoir, and a direct current power supply. The first bath reservoir contains a first electrolyte solution that includes an alkaline copper-complexed solution. The second bath reservoir contains a second electrolyte solution that includes an acidic copper plating solution. The direct current power supply generates a first direct current between the clamp and the first anode to electroplate a first copper layer on the cobalt layer of the wafer submerged in the first electrolyte solution. The direct current power supply then generates a second direct current between the clamp and the second anode to electroplate a second copper layer on the first copper layer of the wafer submerged in the second electrolyte solution.

Figure 1A:
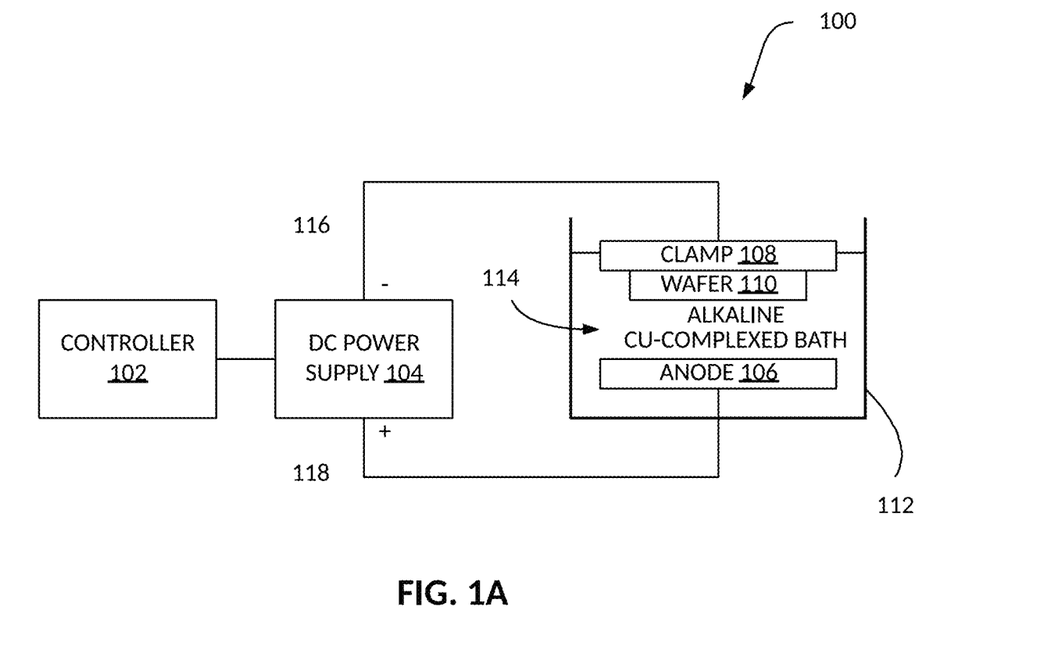
FIG. 1A is a block diagram of an electroplating system using a first electroplating bath, according to an example embodiment.

FIG. 1A is a block diagram of an electroplating system 100 using a first electroplating bath, according to an example embodiment. The electroplating system 100 comprises a bath reservoir 112, a clamp 108, an anode 106, a direct current (DC) power supply 104, and a controller 102.

The bath reservoir 112 contains an alkaline complexed-copper electrolyte solution 114. In one example, the alkaline complexed-copper electrolyte solution 114 includes low copper (e.g., from about 0.5 g/L to about 2.0 g/L), complexing ligands (e.g., ethylenediaminetetraacetic acid or referred to as EDTA) and additives (e.g., accelerator and suppressor). The alkaline complexed-copper electrolyte solution 114 is continuously provided to the bath reservoir 112 with a pump (not shown). The alkaline complexed-copper electrolyte solution 114 is circulated into and out of the bath reservoir 112 by the pump.

The clamp 108 holds a wafer 110 submerged in the alkaline complexed-copper electrolyte solution 114. In one example, the clamp 108 includes a holding apparatus, such as a chuck, mounted to a spindle that allows rotation of the clamp 108 and the wafer 110.

The wafer 110 comprises features (vias and trenches) deposited with a cobalt layer using, for example, an atomic layer deposition (ALD) process or a chemical vapor deposition (CVD) process.

The DC power supply 104 generates a direct current flow between the clamp 108 and the anode 106. The DC power supply 104 includes a negative output electrode 116 and a positive output electrode 118. The negative output electrode 116 is electrically connected to the clamp 108 and the wafer 110. The positive output electrode 118 is electrically connected to the anode 106 located in the alkaline complexed-copper electrolyte solution 114. The anode 106 is located opposite to the wafer 110 in the alkaline complexed-copper electrolyte solution 114.

The controller 102 is connected to the DC power supply 104 and is programmed to control the DC power supply 104. For example, the controller 102 includes program instructions specifying current and voltage levels that are to be applied to the wafer 110 along with durations and times at which the current and voltage levels change. In one example embodiment, the controller 102 controls the DC power supply 104 to generate forward pulses between the clamp 108/the wafer 110 and the anode 106. During a forward pulse, the DC power supply 104 biases the wafer 110 to have a negative potential relative to the anode 106. This causes an electrical current to flow from the anode 106 to the wafer 110, and an electrochemical reduction (e.g., $Cu^{2+}+2e^-\rightarrow Cu^0$) occurs on the wafer surface (the cathode), which results in the deposition of copper on the surface of the wafer 110.

In another example embodiment, the controller 102 controls the DC power supply 104 to generate a combination of forward and reverse pulses between the clamp 108/the wafer 110 and the anode 106. The forward pulse includes a direct current for a predefined duration (e.g., 100 ms) that causes copper from the alkaline complexed-copper electrolyte solution 114 to be deposited on the wafer 110. The reverse pulse includes a direct current of reverse polarity for a predefined duration (e.g., 10 ms) that causes copper from the wafer 110 to be removed. During a reverse pulse, the opposite takes place: the reaction on the wafer surface is an oxidation (e.g., $Cu^0\rightarrow Cu^{2+}+2e^-$) that results in the removal of copper from the surface of the wafer 110.

Figure 1B:
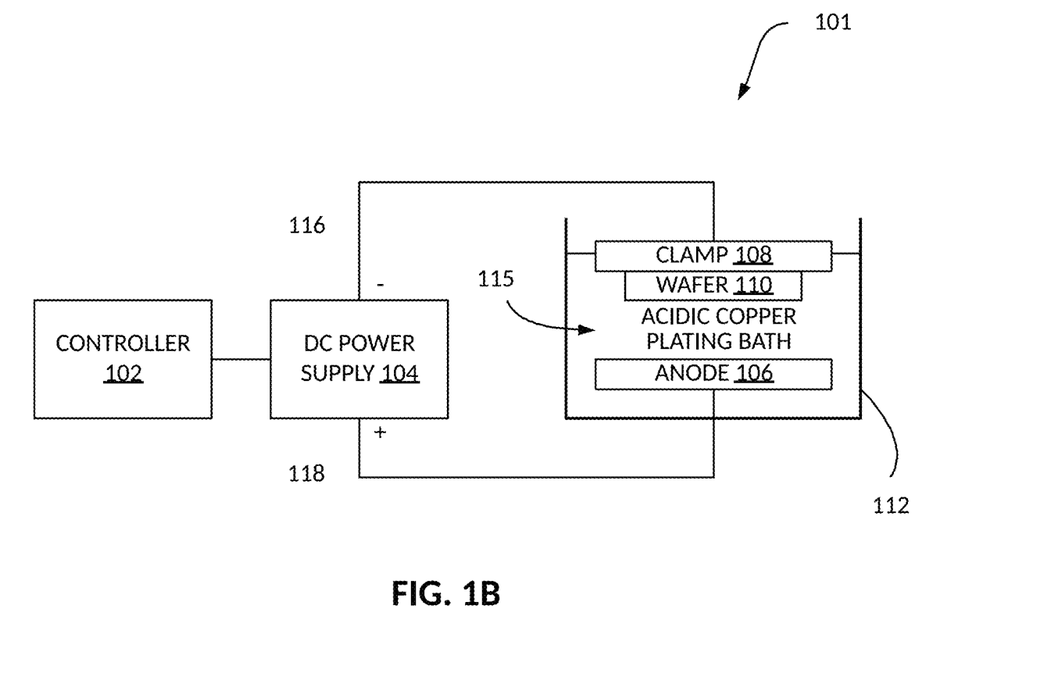
FIG. 1B is a block diagram of an electroplating system using a second electroplating bath, according to an example embodiment.

FIG. 1B is a block diagram of an electroplating system 101 using a second electroplating bath, according to an example embodiment. The bath reservoir 112 contains an acidic copper plating electrolyte solution 115. In one example, the acidic copper plating electrolyte solution 115 includes Copper (e.g., from about 2 g/L to about 40 g/L), acid (e.g., about 10 g/L to about 20 g/L) and Chloride (e.g., 30 ppm to about 100 ppm). The acidic copper plating electrolyte solution 115 is continuously provided to the bath reservoir 112 with a pump (not shown). The acidic copper plating electrolyte solution 115 is circulated into and out of the bath reservoir 112 by the pump.

In one example embodiment, FIGS. 1A and 1B illustrate a same bath reservoir 112 being used for both the alkaline complexed-copper electrolyte solution 114 and the acidic copper plating electrolyte solution 115. The alkaline complexed-copper electrolyte solution 114 is drained from the bath reservoir 112 and is replaced with the acidic copper plating electrolyte solution 115. In another example embodiment, a different electroplating system may be used for each electroplating solution. For example, a separate bath reservoir and anode may be used for each electroplating solution. Those of ordinary skill in the art will recognize that other variations of the electroplating system may be used to electroplate first with the alkaline complexed-copper electrolyte solution 114 and subsequently with the acidic copper plating electrolyte solution 115.

Figure 2:
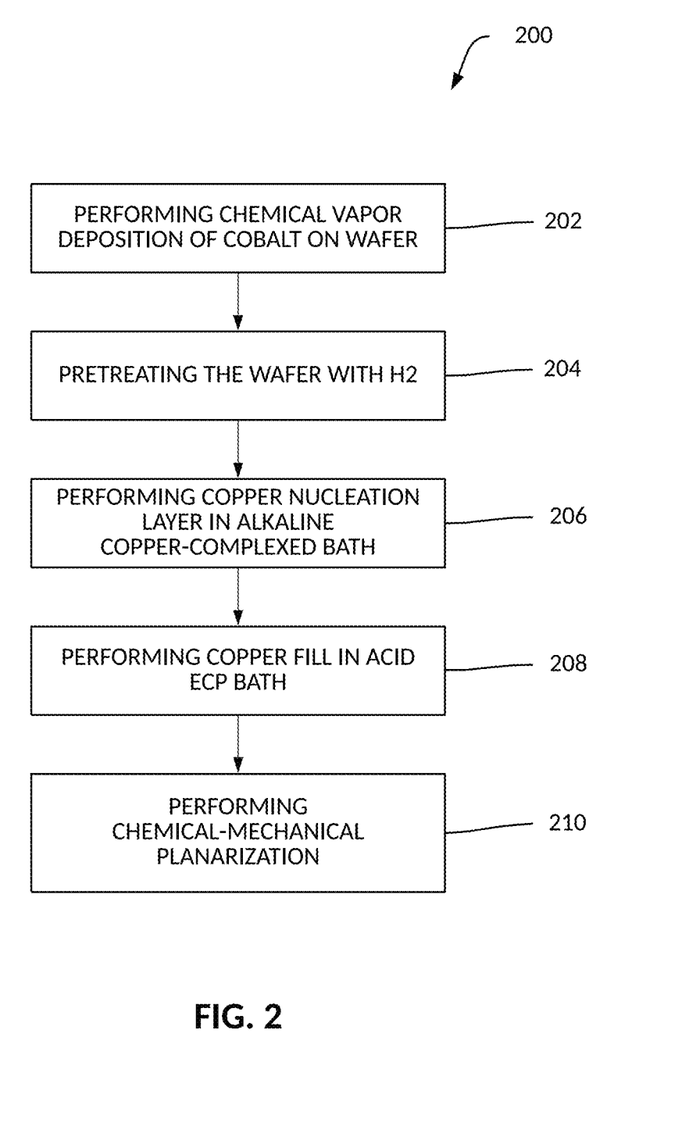
FIG. 2 is a flow chart for a method for processing a wafer, according to an example embodiment.

FIG. 2 is a flow chart for a method 200 for processing a wafer, according to an example embodiment. The method 200 comprises, at operation 202, performing CVD (or ALD) of cobalt on the wafer 110. An ALD process deposits a very thin layer of cobalt using alternating doses of precursor material that first saturates the surface and then forms the thin cobalt layer deposit. A CVD process involves providing one or more gaseous reactants to a chamber that react to deposit a cobalt film on the surface of the wafer. Although ALD and CVD processes are commonly used to deposit a cobalt (or other semi-noble metal) layer, other deposition processes may be used. At operation 204, the wafer 110 is pretreated with hydrogen-helium plasma and at a temperature between about 75° C. and about 250° C.; at operation 206, the electroplating system deposits a copper nucleation layer on the wafer that is in an alkaline copper-complexed bath includes low copper (e.g., about 0.5 g/L to about 2.0 g/L), complexing ligands (e.g., EDTA) and additives (e.g., accelerator and suppressor); at operation 208, a copper fill is performed in a separate acid copper plating bath that includes Copper (e.g., about 2 g/L to about 4.0 g/L), acid (e.g., about 10 g/L to about 20 g/L) and Chloride (about 30 ppm to about 100 ppm) after the alkaline copper-complexed bath; at operation 210, a chemical-mechanical planarization (CMP) is performed to planarize the wafer 110 and to remove excess copper.

Figure 3:
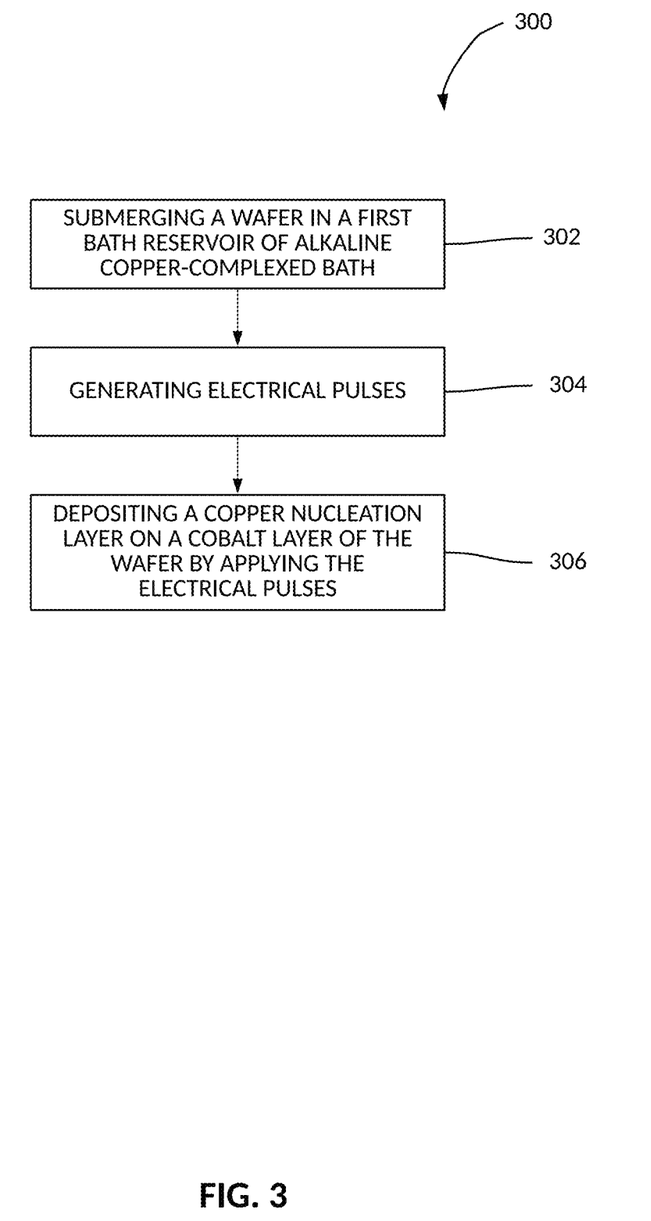
FIG. 3 is a flow chart for a method for electroplating, according to an example embodiment.

The present disclosure also includes another example method. In one example, with reference to FIG. 3, an electroplating method 300 comprises, at operation 302, submerging a wafer in a first bath reservoir containing a first electrolyte solution (e.g., alkaline-based solution); at operation 304, generating electrical pulses (e.g., direct current from a direct current power supply); and at operation 306, depositing a copper nucleation layer on a cobalt layer of the wafer by applying the electrical pulses to the wafer and an anode disposed opposite to the wafer in the first electrolyte solution.

In some examples, a combination of forward and reverse pulses includes the high convection forward pulse, followed by the high convection reverse pulse, followed by the low convection reverse pulse. The high convection forward pulse and the high convection reverse pulse each includes a convection of at least about 150 rpm. The high convection forward pulse comprises a forward direct current with an intensity of at least about 0.85 mA/cm$^2$ for at least about 100 ms, and no direct current for at least about 200 ms following the forward direct current. The high convection reverse pulse comprises a forward direct current with an intensity of at least about 0.85 mA/cm$^2$ for at least about 100 ms, a reverse direct current with an intensity of at least about −0.85 mA/cm$^2$ for at least about 10 ms following the forward direct current, and no direct current for at least about 200 ms following the reverse direct current. The low convection reverse pulse includes a convection of at most about 20 rpm, wherein the low convection reverse pulse comprises a forward direct current with an intensity of at least about 0.85 mA/cm$^2$ for at least about 100 ms, a reverse direct current with an intensity of at least about −0.85 mA/cm$^2$ for at least 10 ms following the forward direct current, and no direct current for at least about 200 ms following the reverse direct current. The electrolyte solution comprises an alkaline complexed-copper electrolyte solution.

Figure 4:
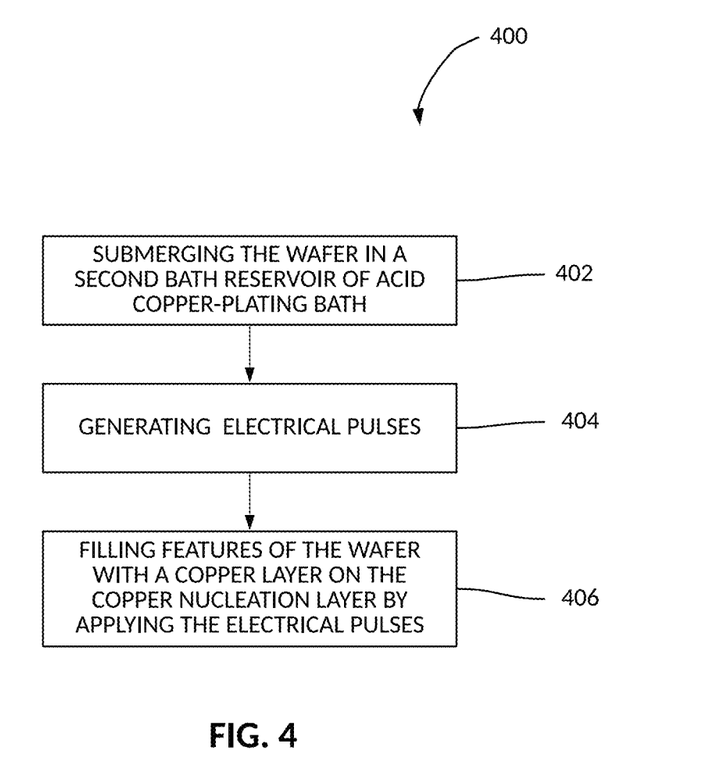
FIG. 4 is a flow chart for a method for electroplating, according to another example embodiment.

FIG. 4 is a flow chart for a method 400 for electroplating a wafer, according to another example embodiment. The method 400 comprises, at operation 402, submerging the wafer in a second bath reservoir containing a second electrolyte solution (e.g., acid based solution) following the first electrolyte solution; at operation 404, the direct current power supply generating electrical pulses; and at operation 306, filling features (vias, trenches) of the wafer with a copper layer on the copper nucleation layer of the wafer by applying the electrical pulses to the wafer and an anode disposed opposite to the wafer in the second electrolyte solution.

Figure 5:
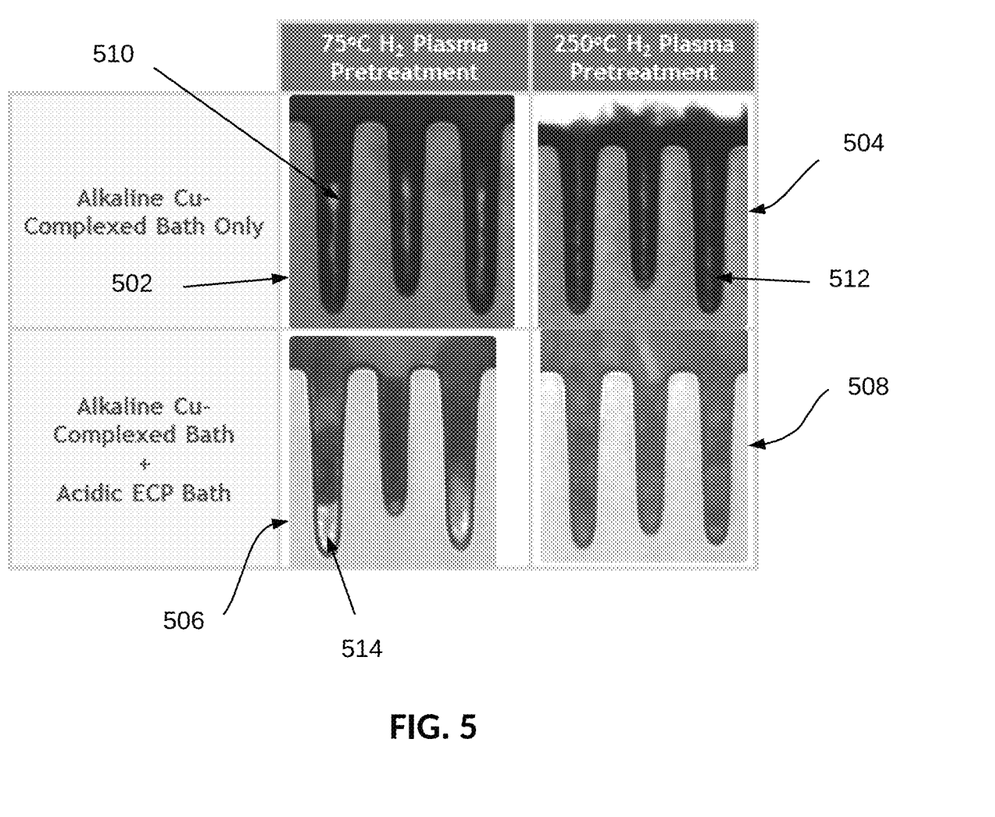
FIG. 5 is a cross-sectional depiction of a wafer illustrating examples of copper layer deposit on the cobalt layer.

FIG. 5 is a cross-sectional depiction of a wafer using different electroplating bath and plasma pretreatment. A cross-section 502 of features of a wafer illustrates seams 510 when the wafer is electroplated using a single alkaline-based electroplating bath with a plasma pretreatment of about 75° C. A cross-section 504 of features of a wafer illustrates seams 512 when the wafer is electroplated using a single alkaline-based electroplating bath with a plasma pretreatment of about 250° C. A cross-section 506 of features of a wafer illustrates void 514 when the wafer is electroplated using an alkaline-based electroplating bath followed by an acid-based electroplating bath with a plasma pretreatment of about 75° C. A cross-section 508 of features of a wafer is free of voids and seams when the wafer is electroplated using an alkaline-based electroplating bath followed by an acid-based electroplating bath with a plasma pretreatment of about 250° C.

In some other examples, a combination of forward and reverse pulses may be applied to the wafer (in the first or second electroplating solution or in the first and second electroplating solution). The combination includes a high convection forward pulse, a high convection reverse pulse, and a low convection reverse pulse. The high convection forward pulse and the high convection reverse pulse each includes a convection of at least 150 rpm. The high convection forward pulse comprises a forward direct current with an intensity of at least about 0.85 mA/cm$^2$ for at least about 100 ms, and no direct current for at least about 200 ms following the forward direct current. The high convection reverse pulse comprises a forward direct current for at least about 100 ms, a reverse direct current for at least about 10 ms following the forward direct current, and no direct current for at least about 200 ms following the reverse direct current. The low convection reverse pulse includes a convection of at most about 20 rpm, wherein the low convection reverse pulse comprises a forward direct current with an intensity of at least about 0.85 mA/cm$^2$ for at least about 100 ms, a reverse direct current with an intensity of at least about −0.85 mA/cm$^2$ for at least about 10 ms following the forward direct current, and no direct current for at least 200 ms following the reverse direct current. The electrolyte solution comprises an alkaline complexed-copper electrolyte solution.

In some examples, a non-transitory machine-readable medium includes instructions that, when read by a machine, cause the machine to control operations in methods comprising at least the non-limiting example operations summarized above.

Figure 6:
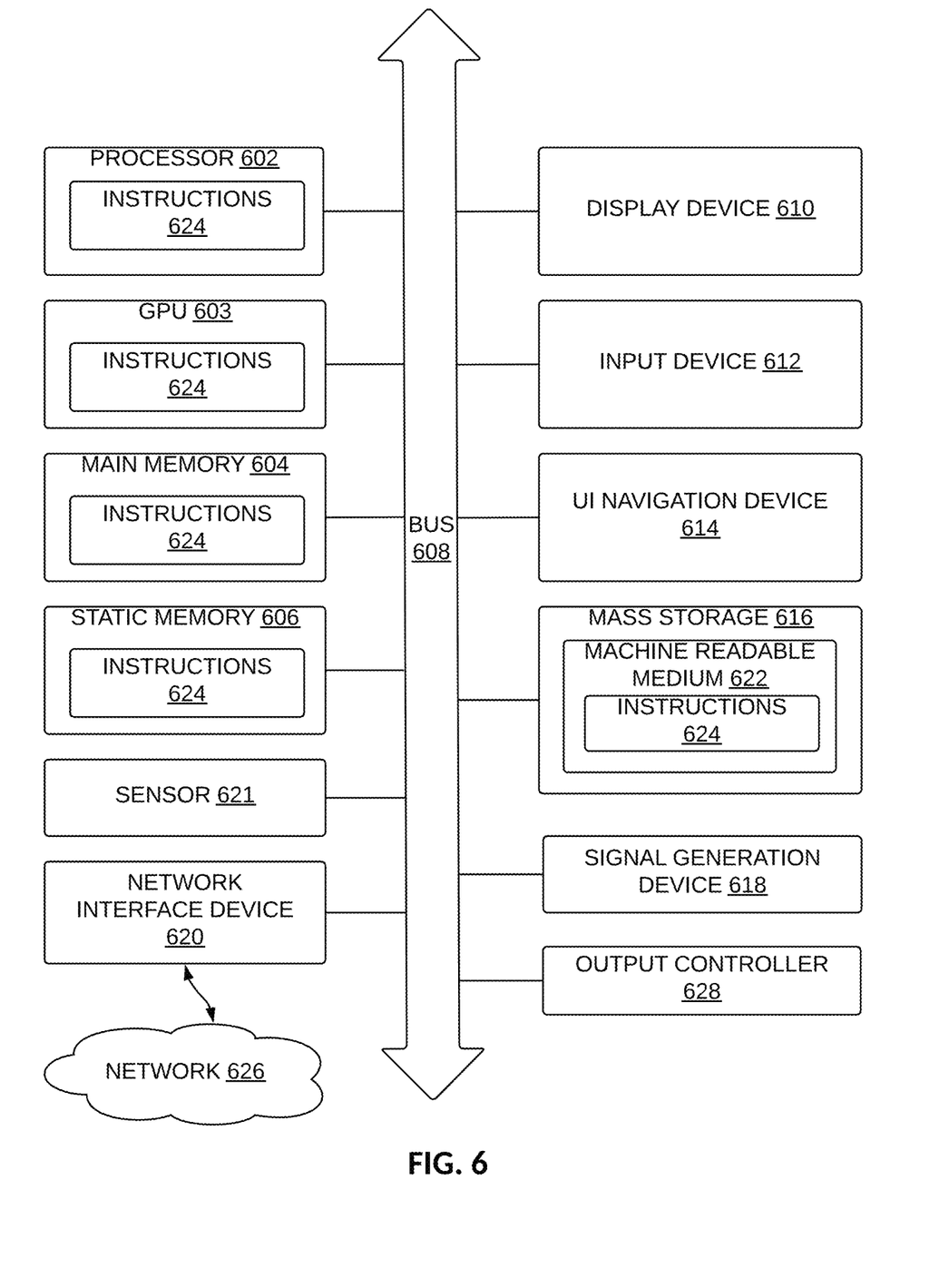
FIG. 6 is a block diagram illustrating an example of a machine upon which one or more example embodiments may be implemented, or by which one or more example embodiments may be controlled.

FIG. 6 is a block diagram illustrating an example of a machine 600 upon which one or more example process embodiments described herein may be implemented, or by which one or more example process embodiments described herein may be controlled. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in a peer-to-peer (P2P) (or other distributed) network environment. Further, while only a single machine 600 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, and a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 602 (e.g., a central processing unit (CPU), a hardware processor core, or any combination thereof), a graphics processing unit (GPU) 603, a main memory 604, and a static memory 606, some or all of which may communicate with each other via an interlink (e.g., bus) 608. The machine 600 may further include a display device 610, an alphanumeric input device 612 (e.g., a keyboard), and a user interface (UI) navigation device 614 (e.g., a mouse). In an example, the display device 610, alphanumeric input device 612, and UI navigation device 614 may be a touch screen display. The machine 600 may additionally include a mass storage device (e.g., drive unit) 616, a signal generation device 618 (e.g., a speaker), a network interface device 620, and one or more sensors 621, such as a Global Positioning System (GPS) sensor, compass, accelerometer, or another sensor. The machine 600 may include an output controller 628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 616 may include a machine-readable medium 622 on which is stored one or more sets of data structures or instructions 624 (e.g., software) embodying or utilized by any one or more of the techniques or functions described herein. The instructions 624 may also reside, completely or at least partially, within the main memory 604, within the static memory 606, within the hardware processor 602, or within the GPU 603 during execution thereof by the machine 600. In an example, one or any combination of the hardware processor 602, the GPU 603, the main memory 604, the static memory 606, or the mass storage device 616 may constitute machine-readable media 622.

While the machine-readable medium 622 is illustrated as a single medium, the term "machine-readable medium" may include a single medium or multiple media (e.g., a centralized or distributed database, and/or associated caches and servers) configured to store the one or more instructions 624.

The term "machine-readable medium" may include any medium that can store, encode, or carry instructions 624 for execution by the machine 600 and that cause the machine 600 to perform any one or more of the techniques of the present disclosure, or that can store, encode, or carry data structures used by or associated with such instructions 624. Non-limiting machine-readable medium examples may include solid-state memories, and optical and magnetic media. In an example, a massed machine-readable medium comprises a machine-readable medium 622 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 624 may further be transmitted or received over a communications network 626 using a transmission medium via the network interface device 620.

Although an embodiment has been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

What is claimed is:

1. A method for electroplating a wafer, the method comprising:
    submerging the wafer in a first bath reservoir containing a first electrolyte solution, the first electrolyte solution including an alkaline copper-complexed solution, the wafer comprising features deposited with a cobalt layer;
    electroplating the wafer with a first layer of copper on the cobalt layer by applying electrical pulses to the wafer and a first anode disposed in the first electrolyte solution;
    removing the wafer from the first bath reservoir and submerging the wafer in a second bath reservoir containing a second electrolyte solution, the second electrolyte solution comprising an acidic copper-plating solution; and
    electroplating the wafer with a second layer of copper on the first layer of copper by applying electrical pulses to the water and a second anode disposed in the second electrolyte solution.

2. The method of claim 1, wherein the first copper layer includes a copper nucleation layer formed on top of the cobalt layer of the wafer.

3. The method of claim 2, wherein the second copper layer includes a copper fill layer formed on top of the copper nucleation layer, the copper fill layer configured to fill the features of the wafer.

4. The method of claim 1, further comprising:
pre-treating the wafer with a hydrogen-helium plasma treatment prior to the wafer being submerged in the first electrolyte solution.

5. The method of claim 4, wherein the hydrogen-helium plasma has a temperature between 75 degrees Celsius and 250 degrees Celsius.

6. The method of claim 4, further comprising:
depositing the cobalt layer on the wafer via chemical vapor deposition prior to the hydrogen-helium plasma treatment.

7. The method of claim 4, wherein the alkaline copper-complexed solution has a pH greater than 9, wherein the acidic copper plating solution has a pH less than 2.

8. A method comprising:
submerging a wafer in a bath reservoir containing a first electrolyte solution, the first electrolyte solution including an alkaline copper-complexed solution; the wafer comprising features deposited with a cobalt layer;
electroplating the wafer with a first layer of copper on the cobalt layer by applying electrical pulses to the wafer and an anode disposed in the first electrolyte solution;
replacing the first electrolyte solution with a second electrolyte solution in the bath reservoir, the second electrolyte solution comprising an acidic copper plating solution; and
electroplating the wafer with a second layer of copper on the first layer of copper by applying electrical pulses to the wafer and the anode disposed in the second electrolyte solution.

9. The method of claim 8, wherein the first copper layer includes a copper nucleation layer formed on top of the cobalt layer of the wafer.

10. The method of claim 9, wherein the second copper layer includes a copper fill layer formed on top of the copper nucleation layer, the copper fill layer configured to fill the features of the wafer.

11. The method of claim 8, further comprising:
pre-treating the wafer with a helium-hydrogen plasma treatment prior to the wafer being submerged in the first electrolyte solution.

12. The method of claim 11, wherein the helium-hydrogen plasma has a temperature between 75 degrees Celsius and 250 degrees Celsius, wherein the alkaline copper-complexed solution has a pH greater than 9, wherein the acidic copper plating solution has a pH less than 2.

13. A machine-readable medium including instructions which, when read by a machine, cause the machine to control operations in an electroplating method, the electroplating method comprising, at least:
submerging the wafer in a bath reservoir containing a first electrolyte solution; the first electrolyte solution including an alkaline copper-complexed solution, the wafer comprising features deposited with a cobalt layer;
electroplating the wafer with a first layer of copper on the cobalt layer by applying electrical pulses to the wafer and an anode disposed in the first electrolyte solution;
replacing the first electrolyte solution with a second electrolyte solution in the bath reservoir, the second electrolyte solution comprising an acidic copper plating solution; and
electroplating the wafer with a second layer of copper on the first layer of copper by applying electrical pulses to the wafer and the anode disposed in the second electrolyte solution.

* * * * *

UNITED STATES PATENT AND TRADEMARK OFFICE
CERTIFICATE OF CORRECTION

PATENT NO. : 10,930,511 B2
APPLICATION NO. : 15/941267
DATED : February 23, 2021
INVENTOR(S) : Velmurugan et al.

It is certified that error appears in the above-identified patent and that said Letters Patent is hereby corrected as shown below:

In the Claims

In Column 8, Line 59, in Claim 1, delete "water" and insert --wafer-- therefor

In Column 9, Line 18, in Claim 8, delete "solution;" and insert --solution,-- therefor In Column 10, Line 19, in Claim 13, delete "solution;" and insert --solution,-- therefor Signed and Sealed this
Eighteenth Day of October, 2022

Katherine Kelly Vidal
*Director of the United States Patent and Trademark Office*